United States Patent
Robotham et al.

(10) Patent No.: US 11,256,077 B2
(45) Date of Patent: Feb. 22, 2022

(54) LENS FOR A NOTIFICATION STROBE

(71) Applicant: Carrier Corporation, Palm Beach Gardens, FL (US)

(72) Inventors: Martin Paul Robotham, Bradenton, FL (US); Thomas Greenwood, Terra Ceia, FL (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 0 days.

(21) Appl. No.: 17/053,619

(22) PCT Filed: Apr. 30, 2019

(86) PCT No.: PCT/US2019/029806
§ 371 (c)(1),
(2) Date: Nov. 6, 2020

(87) PCT Pub. No.: WO2019/231601
PCT Pub. Date: Dec. 5, 2019

(65) Prior Publication Data
US 2021/0231934 A1    Jul. 29, 2021

Related U.S. Application Data

(60) Provisional application No. 62/678,545, filed on May 31, 2018.

(51) Int. Cl.
*G02B 19/00* (2006.01)
*F21K 9/69* (2016.01)
(Continued)

(52) U.S. Cl.
CPC ............ *G02B 19/0061* (2013.01); *F21K 9/69* (2016.08); *G02B 19/0014* (2013.01); *G08B 5/38* (2013.01);
(Continued)

(58) Field of Classification Search
CPC .. G08B 5/38; G02B 19/0061; G02B 19/0014; F21Y 2115/10; F21V 5/04; F21V 33/0076; F21K 9/69
See application file for complete search history.

(56) References Cited

U.S. PATENT DOCUMENTS

| | | | |
|---|---|---|---|
| 2011/0012746 A1* | 1/2011 | Fish, Jr. | F21V 7/09 362/297 |
| 2014/0009301 A1* | 1/2014 | Robotham | G08B 5/38 340/691.1 |

(Continued)

FOREIGN PATENT DOCUMENTS

| | | | | |
|---|---|---|---|---|
| EP | 2345309 B1 | 7/2011 | | |
| EP | 2345309 B1 * | 11/2017 | | G08B 7/06 |

OTHER PUBLICATIONS

International Preliminary Report on Patentability for International Application No. PCT/US2019/029806 dated Dec. 10, 2020.

(Continued)

*Primary Examiner* — Erin Kryukova
(74) *Attorney, Agent, or Firm* — Carlson, Gaskey & Olds, P.C.

(57) ABSTRACT

A notification appliance (10) includes a lighting element (30) and strobe drive electronics (18) mounted on a single printed circuit board (14). A lens (20) is mounted to the printed circuit board (14) over the lighting element (30). The lens (20) includes a cavity (35) disposed over the lighting element (30). The lens (20) is shaped to focus light from the lighting element (30) into a far-field lighting pattern (40) including a visible first arc (42) that subtends approximately a 90° angle in a first plane, a visible second arc (44) that subtends approximately a 180° angle in a second plane, and two visible spots (46), each spot (46) on an opposite side of (Continued)

the first arc (42) from the other. A lens (20) for a notification appliance (10) is also disclosed.

17 Claims, 10 Drawing Sheets

(51) Int. Cl.
  *G08B 5/38*   (2006.01)
  *F21Y 115/10*  (2016.01)
  *F21V 5/04*   (2006.01)
  *F21V 33/00*  (2006.01)

(52) U.S. Cl.
  CPC ............. *F21V 5/04* (2013.01); *F21V 33/0076* (2013.01); *F21Y 2115/10* (2016.08)

(56) References Cited

U.S. PATENT DOCUMENTS

| | | | |
|---|---|---|---|
| 2015/0146435 A1* | 5/2015 | Greenwood | ............ F21V 5/045 |
| | | | 362/311.02 |
| 2017/0059147 A1 | 3/2017 | Schmidt et al. | |
| 2017/0138563 A1* | 5/2017 | Leung | ...................... G08B 5/38 |
| 2017/0316660 A1* | 11/2017 | Chong | ................... G08B 7/066 |
| 2018/0204429 A1* | 7/2018 | Savage, Jr. | ............ G08B 7/066 |

OTHER PUBLICATIONS

International Search Report and Written Opinion for International Application No. PCT/US2019/029806 dated Sep. 20, 2019.

\* cited by examiner

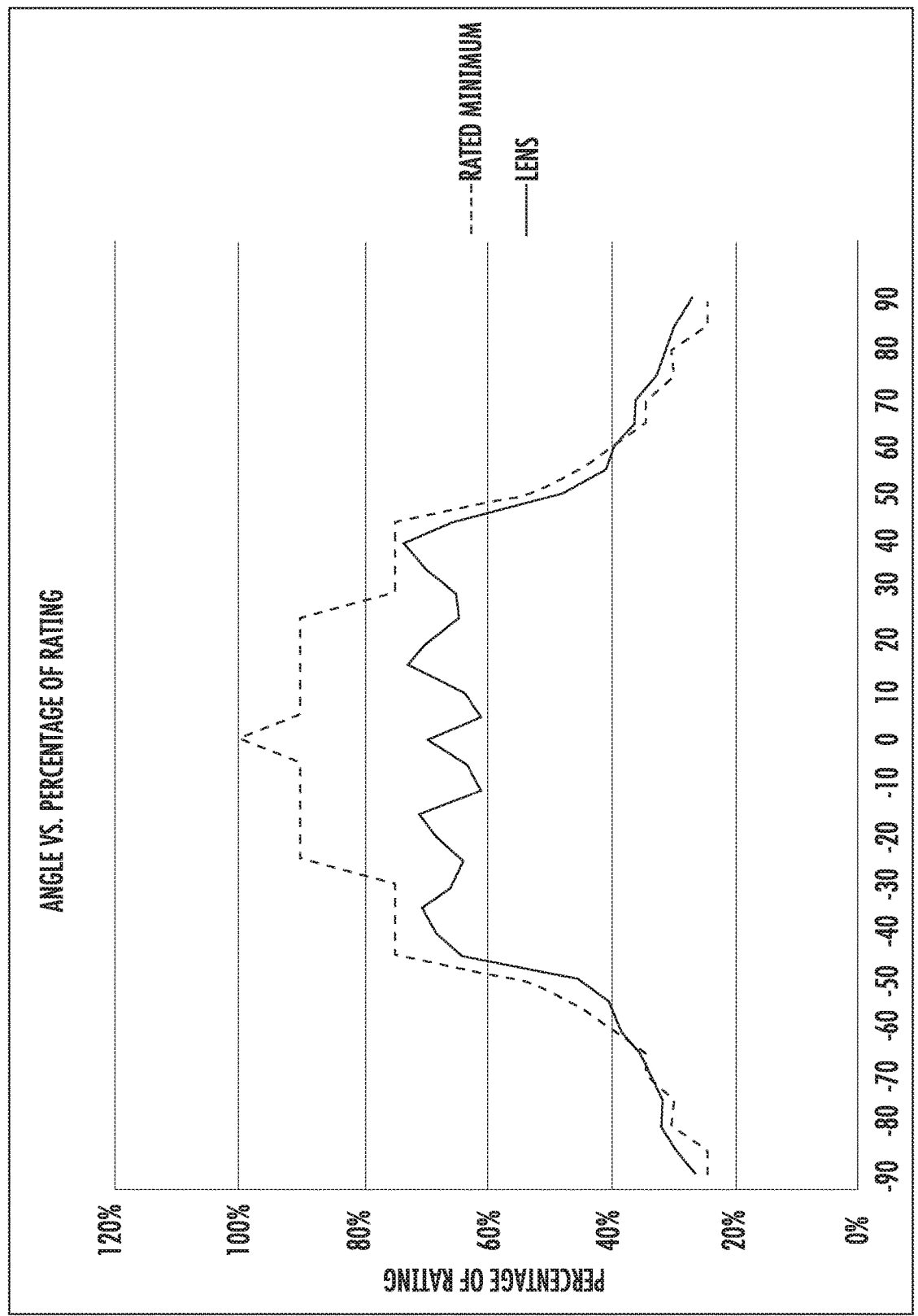

LENS FOR A NOTIFICATION STROBE

BACKGROUND

Notification strobe units are incorporated into alarm systems to provide visual warnings to occupants of a space. The visual warning may indicate fire or provide a mass notification for other hazardous conditions, such as chemical contamination, required evacuation, carbon monoxide, security lock-down, and the like. In most applications, the notification strobes have to comply with building codes and/or certification agency standards for brightness of the light they project, and the angles from which the light must be visible.

To comply with those standards, known notification strobes have their lighting element mounted out of the plane of the main printed circuit board (PCB), in other words, away from a PCB having a strobe-drive, management and interface electronics and/or the electro-mechanical interface to the power line. This separation allows the lighting element to be spatially offset from the other components of the strobe unit which may block the light, allowing the light from the element to be visible from the required angles. Further, spacing the light element from the waste heat emanating from the light-engine and interface electronics limits incident heating of the lighting element. Further, thermally conductive cladding such as aluminum used in the PCB construction may also be used to dissipate heat generated by the lighting element.

To meet brightness standards, known notification strobe units require so much power that the driver and interface electronics produce relatively large amounts of heat relative to the amount of light. Because of this heat production, internal temperatures in some known notification strobe units can significantly exceed ambient temperatures. Light emitting diodes (LEDs) are frequently used as lighting elements in notification strobes because they are more energy efficient than many alternatives, but the high internal temperatures of some known strobe units can cause LEDs to operate at less than optimal efficiency. For example, for a given LED at a fixed drive current, a 60° C. increase in temperature might reduce light output by about 10%. Known strobe unit designs thus require some combination of spacing between the LED and PCB, heat dissipating cladding, and extra power in order to maintain required light output.

SUMMARY

A notification appliance according to an exemplary embodiment of this disclosure, among other possible things includes a lighting element and strobe drive electronics mounted on a single printed circuit board. A lens mounted to the printed circuit board over the lighting element. the lens includes a cavity disposed over the lighting element. The lens is shaped to focus light from the lighting element into a far field lighting pattern including a visible first arc that subtends approximately a 90° angle in a first plane, a visible second arc that subtends approximately a 180° angle in a second plane, and two visible spots, both spots on an opposite side of the first bar from the other.

In a further embodiment of the foregoing notification appliance, the lens includes an exterior surface including a slope portion having a convex shape approximating an ovoid with major diameter oriented about an axis.

In a further embodiment of any of the foregoing notification appliances, the lens includes an arch portion adjacent to the slope portion in an axial direction running along the axis. The arch is axially concave and laterally linear.

In a further embodiment of any of the foregoing notification appliances, a hood portion extends from the slope portion on a side opposite from the arch. The hood portion has a convex shape approximating an ovoid with major diameter oriented perpendicular to the major diameter of the slope portion.

In a further embodiment of any of the foregoing notification appliances, the lens includes a reflective surface under the arch portion and curved to reflect light from the lighting element out through the arch portion.

In a further embodiment of any of the foregoing notification appliances, the cavity is defined by a faceted interior surface.

In a further embodiment of any of the foregoing notification appliances, the faceted interior surface includes an axially upper portion faceted to direct light from the lighting element to a reflective surface under the arch portion. An axially medial portion is faceted to direct light from the lighting element out through the slope portion. An axially lower portion is faceted to direct light from the lighting element out through the hood portion.

In a further embodiment of any of the foregoing notification appliances, the axially upper portion is contiguous with the axially medial portion and the axially medial portion is contiguous with the axially lower portion.

In a further embodiment of any of the foregoing notification appliances, the axially upper portion, axially medial portion, and axially lower portion extend laterally across a substantial entirety of the faceted interior surface at their respective axial locations.

In a further embodiment of any of the foregoing notification appliances, the lens further includes two nodes on the slope near the hood portion and on opposite sides of the hood portion. The cavity further includes two legs. Each leg extends toward one of the nodes. Portions of a faceted interior surface of the lens extending over the legs are faceted to direct light from the lighting element out through the nodes.

In a further embodiment of any of the foregoing notification appliances, the lighting element generates a typical average luminous flux below 20 lm at an average power consumption of below 0.2 W.

In a further embodiment of any of the foregoing notification appliances, further includes strobe control electronics on the circuit board.

A lens for a notification appliance according to an exemplary embodiment of this disclosure, among other possible things includes an exterior surface that includes a slope portion having a convex shape approximating a portion of an ovoid with a major diameter oriented about an axis. An arch portion is adjacent to the slope portion in an axial direction running along the axis. The arch is axially concave and laterally linear. A hood portion extends from the slope portion on a side opposite from the arch portion. The hood portion has a convex shape approximating a portion of an ovoid with a major diameter oriented perpendicular to the major diameter of the slope portion.

In a further embodiment of the foregoing lens, a cavity is defined by a faceted interior surface.

In a further embodiment of any of the foregoing lenses, the faceted interior surface includes an axially upper portion faceted to direct light from the cavity to a reflective surface under the arch portion. An axially medial portion is faceted to direct light from the cavity out through the slope portion.

An axially lower portion is faceted to direct light from the cavity out through the hood portion.

In a further embodiment of any of the foregoing lenses, the reflective surface is curved to reflect light from the axially upper portion out through the arch portion.

In a further embodiment of any of the foregoing lenses, two nodes on the slope, each node disposed on an opposite side of the hood portion from the other.

In a further embodiment of any of the foregoing lenses, the cavity further includes two legs. Each leg extends toward one of the nodes.

In a further embodiment of any of the foregoing lenses, portions of the faceted interior surface extend over the legs, and the portions are faceted to direct light from the cavity toward the nodes.

In a further embodiment of any of the foregoing lenses, the lens is shaped to focus light from the cavity into a far field lighting pattern including a visible first arc that subtends approximately a 90° angle in a first plane, a visible second arc that subtends approximately a 180° angle in a second plane, and two visible spots, both spots on an opposite side of the first bar from the other Although the different examples have the specific components shown in the illustrations, embodiments of this invention are not limited to those particular combinations. It is possible to use some of the components or features from one of the examples in combination with features or components from another one of the examples.

BRIEF DESCRIPTION OF THE DRAWINGS

FIG. 6B is a graph of relative luminous intensity of light rays emanating through a slope surface of the lens.

DETAILED DESCRIPTION

Figure 1:
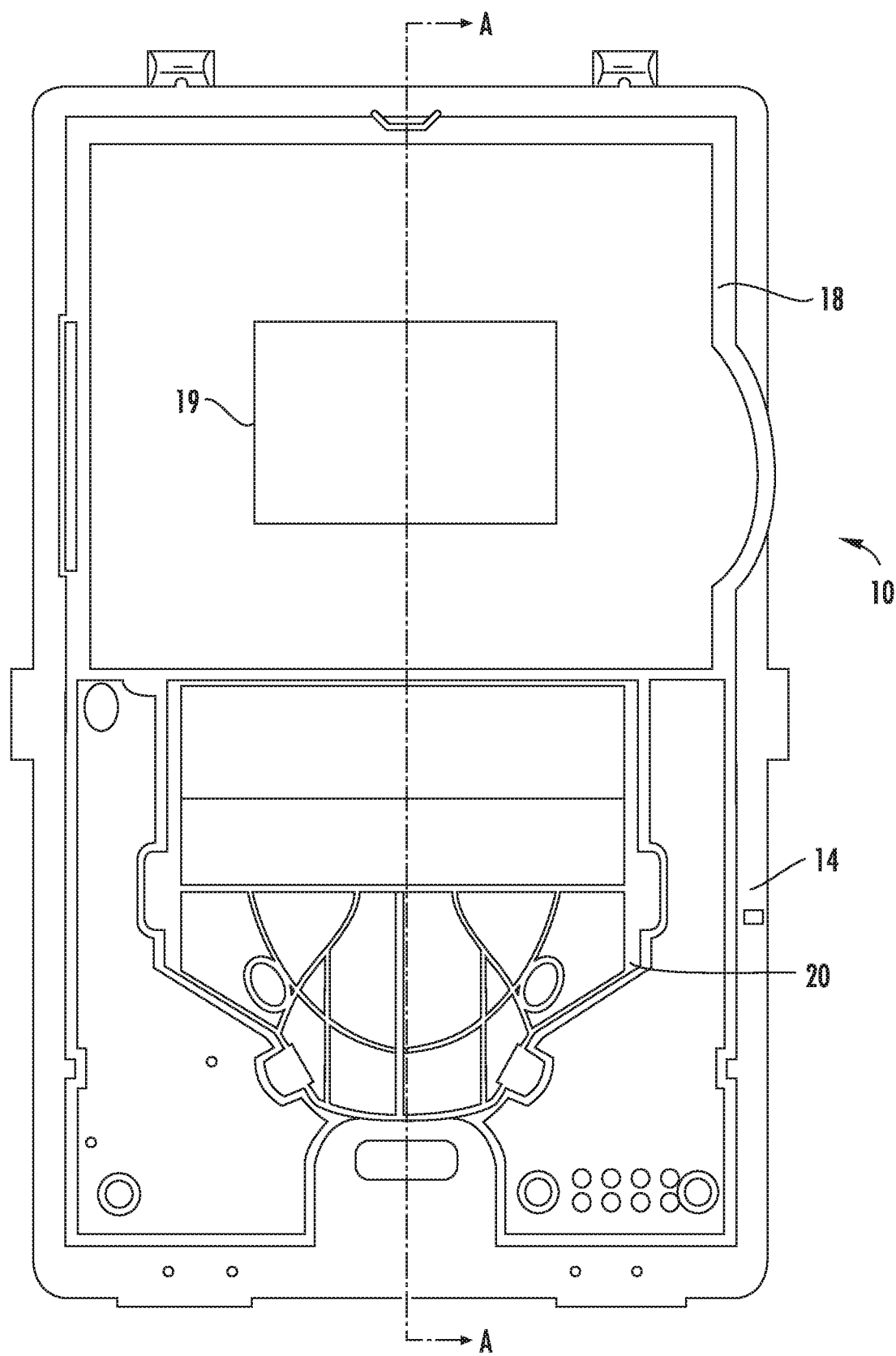
FIG. 1 is a front view of an example notification lighting unit.
Figure 2:
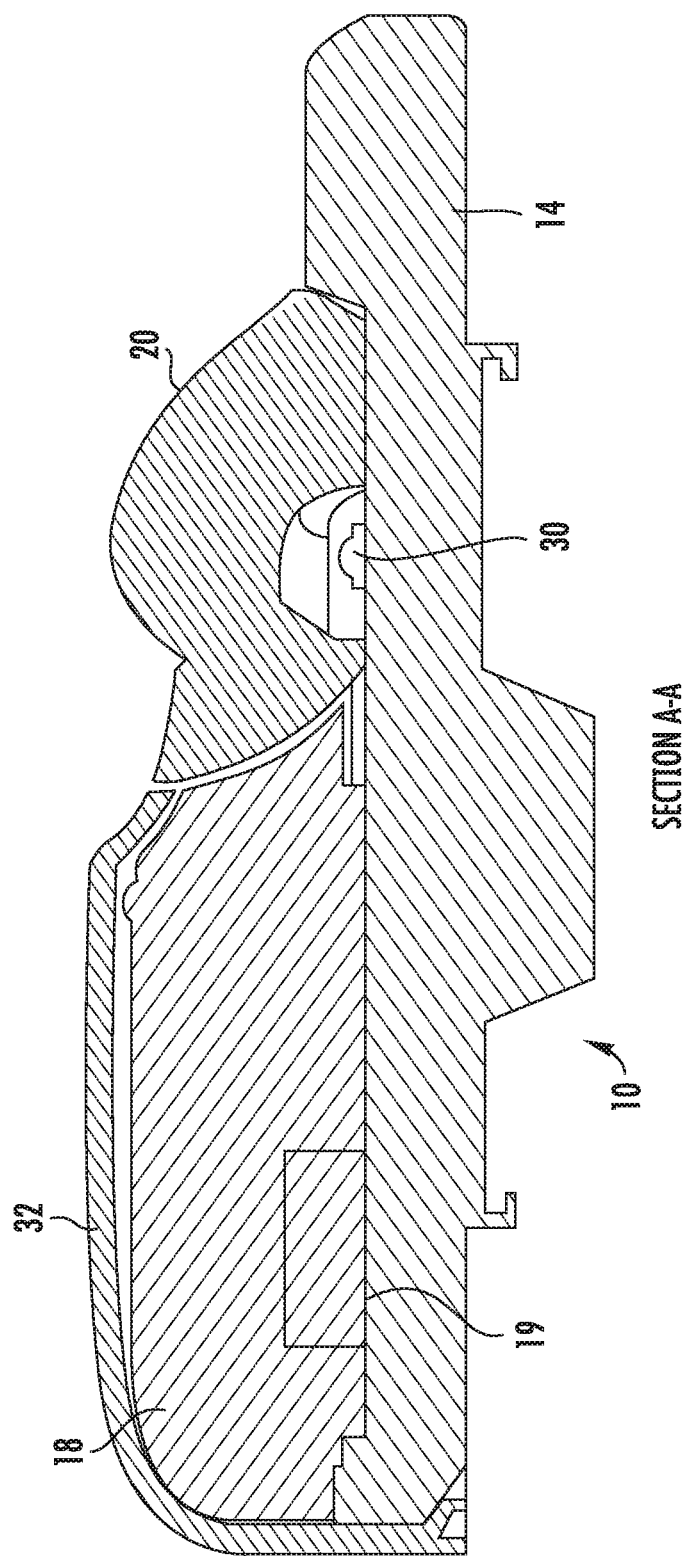
FIG. 2 is a cross section along line A-A of FIG. 1.

Referring to FIGS. 1 and 2, a notification lighting unit 10 has electronics schematically indicated at 18 and a lens 20 mounted on a printed circuit board 14. The lens 20 can be made of a suitable optical material, such as glass or PMMA (Plexiglass). The electronics 18 may include strobe drive, control, management, and interface electronics collectively schematically indicated at 19. A lighting element 30 is mounted to the same circuit board 14 as the electronics 18. The lighting element 30 may be a light emitting diode (LED). Housing 32 encloses the electronics 18 and part of the circuit board 14.

Figure 3:
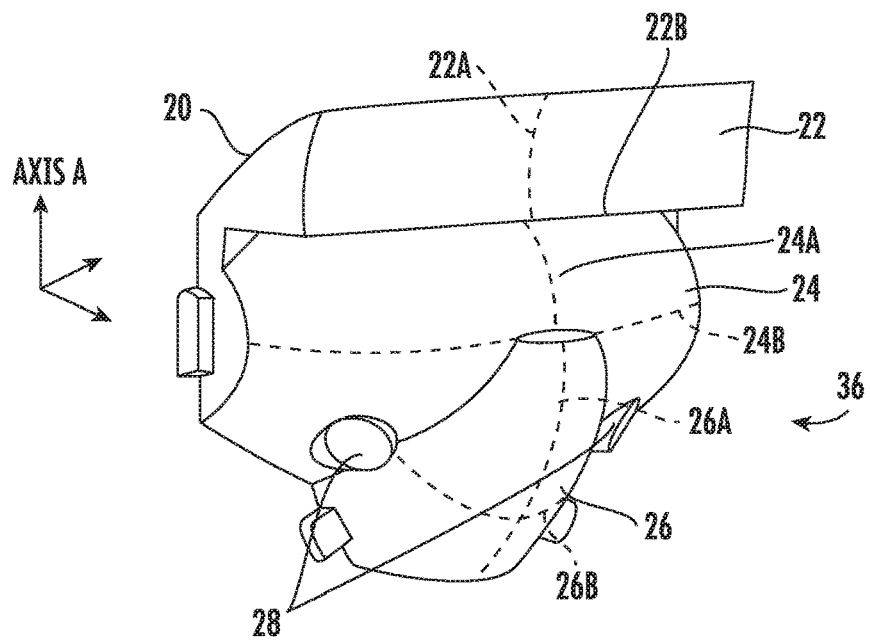
FIG. 3 is an oblique view of a front of an example lens embodiment.
Figure 4A:
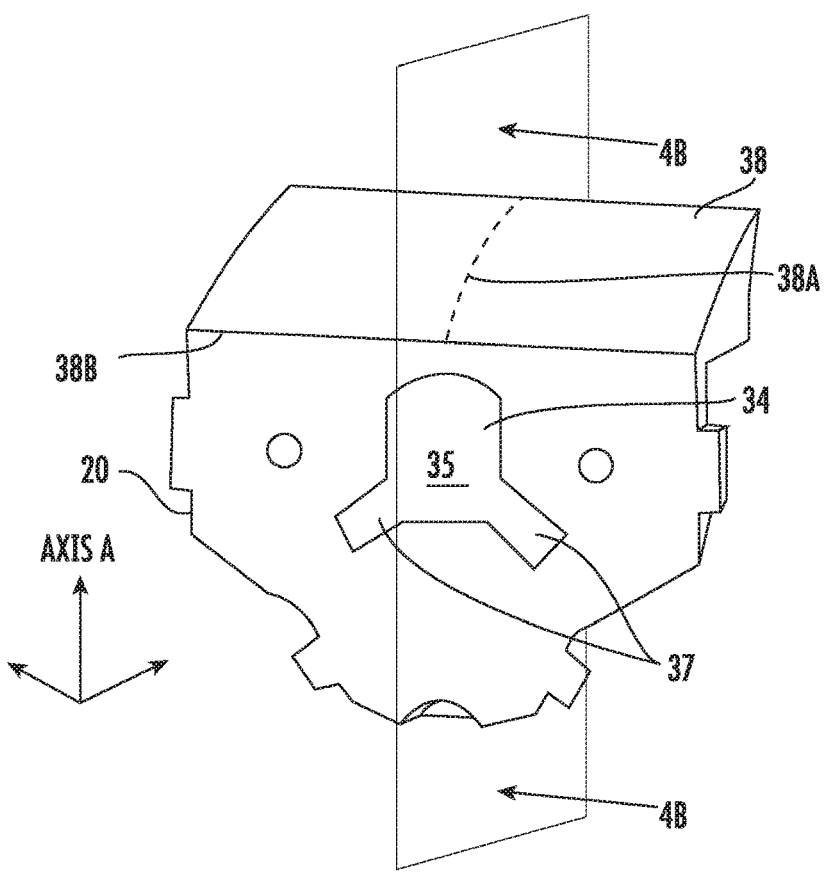
FIG. 4A is an oblique view of a back of an example lens embodiment.

Referring now to FIGS. 3 and 4A, the lens 20 is mounted to the circuit board 14 over the lighting element 30 and includes a cavity 35 disposed over lighting element 30. The lens 20 has a faceted interior surface 34 defining the cavity 35, and an exterior surface 36 opposite the faceted interior surface 34. The exterior surface 36 includes an arch portion 22, a slope portion 24, a hood portion 26, convex nodes 28, and TIR portion 38.

The arch portion 22 has a concave, approximately ellipsoidal curve 22A and a linear edge 22B along two perpendicular cross sections. Edge 22B is along a lateral direction perpendicular to the axial direction with regard to the axis A.

The slope portion 24 is contiguous with the arch portion 22. The slope portion 24 is adjacent to the arch portion 22 in an axial direction. The slope portion 24 has orthogonal convex approximately-ellipsoidal curves 24A, 24B. Curve 24A is along the axial direction, whereas curve 24B is along the lateral direction.

The hood portion 26 is also contiguous with the slope portion 24 and extends from the slope portion 24 on a side opposite from the arch portion 22. The hood portion 26 has a convex approximately-ellipsoidal curve 26A along the axial direction and a convex ellipsoidal curve 26B along the lateral direction.

A "total internal reflection" (TIR) portion 38 is at an axially upper end of the lens 20. The TIR portion 38 has convex, approximately-parabolic face 38A in the axial direction and linear edge 38B in the lateral direction.

The circular nodes 28 are within a field of the slope portion 24. The nodes 28 are two convex surfaces symmetrically disposed about an axial centerline of the lens 20.

The cavity 35 contains two voids formed by legs 37. The legs 37 extend radially outward from the center of the lighting element 30 toward the nodes 28 shown in FIG. 3C.

Figure 4B:
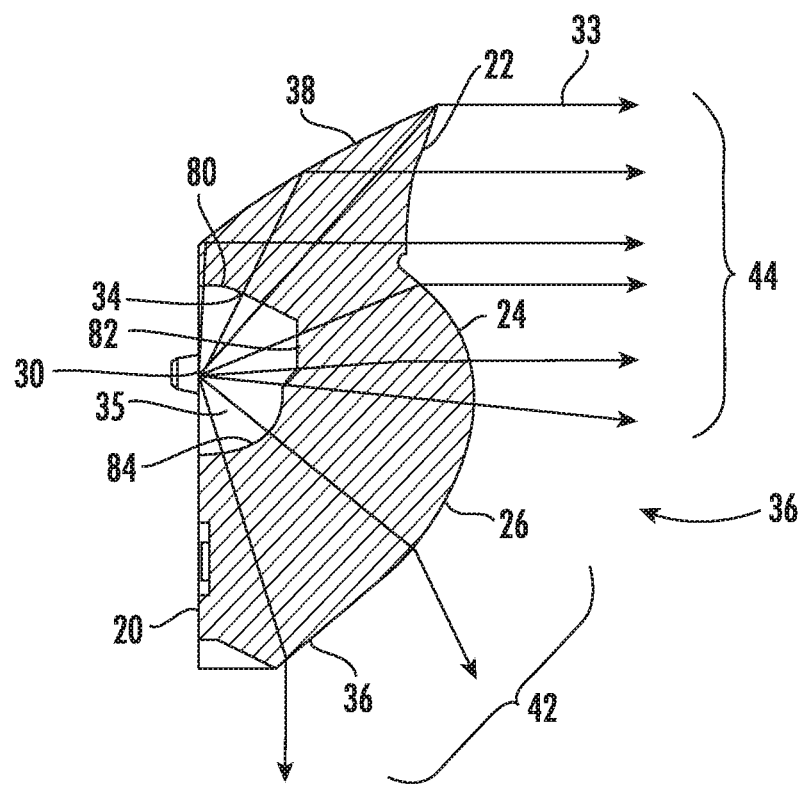
FIG. 4B is a cross section along plane 4B-4B of FIG. 4A.
Figure 4C:
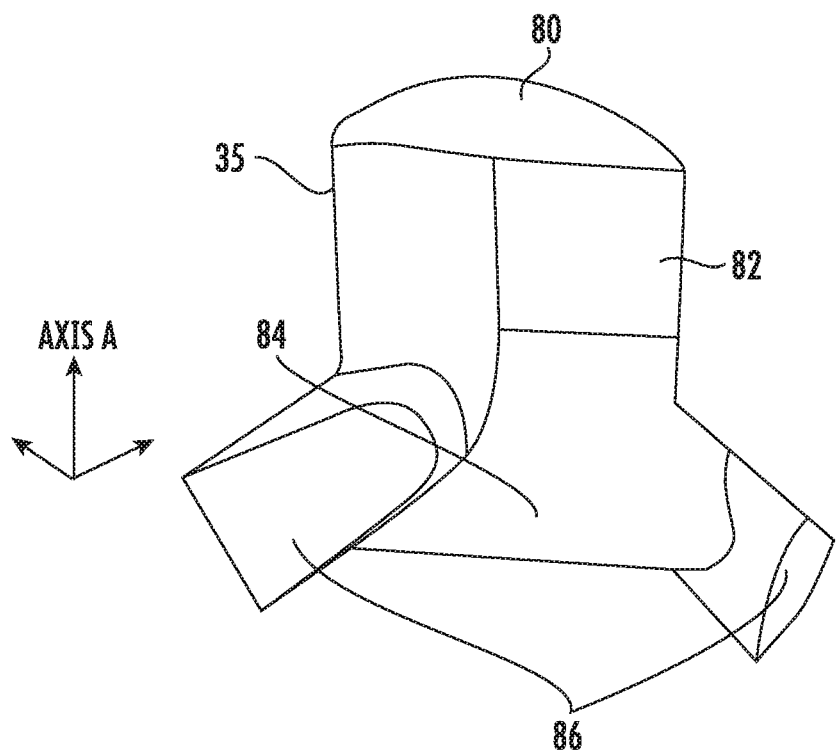
FIG. 4C is an enlarged portion of the oblique view of FIG. 4A.

Turning to FIGS. 4B and 4C, with continuing reference to FIG. 4A, an interior surface 34 includes leg-facets 86 formed at the termination of the legs 37, and axially upper, medial, and lower portions 80, 82, and 84. Portions 80, 82, 84 and leg-facets 86 extend axially and laterally across a substantial entirety of the faceted interior surface 34 and over substantially all of the cavity 35 at their respective locations. The faceted interior surface 34 is intended to capture and focus all, or nearly all, of the light 33 from the lighting element 30, such that the unit 10 can achieve desired lighting intensity at specific angles with minimal power consumption with a relatively low capacity lighting element.

Figure 5:
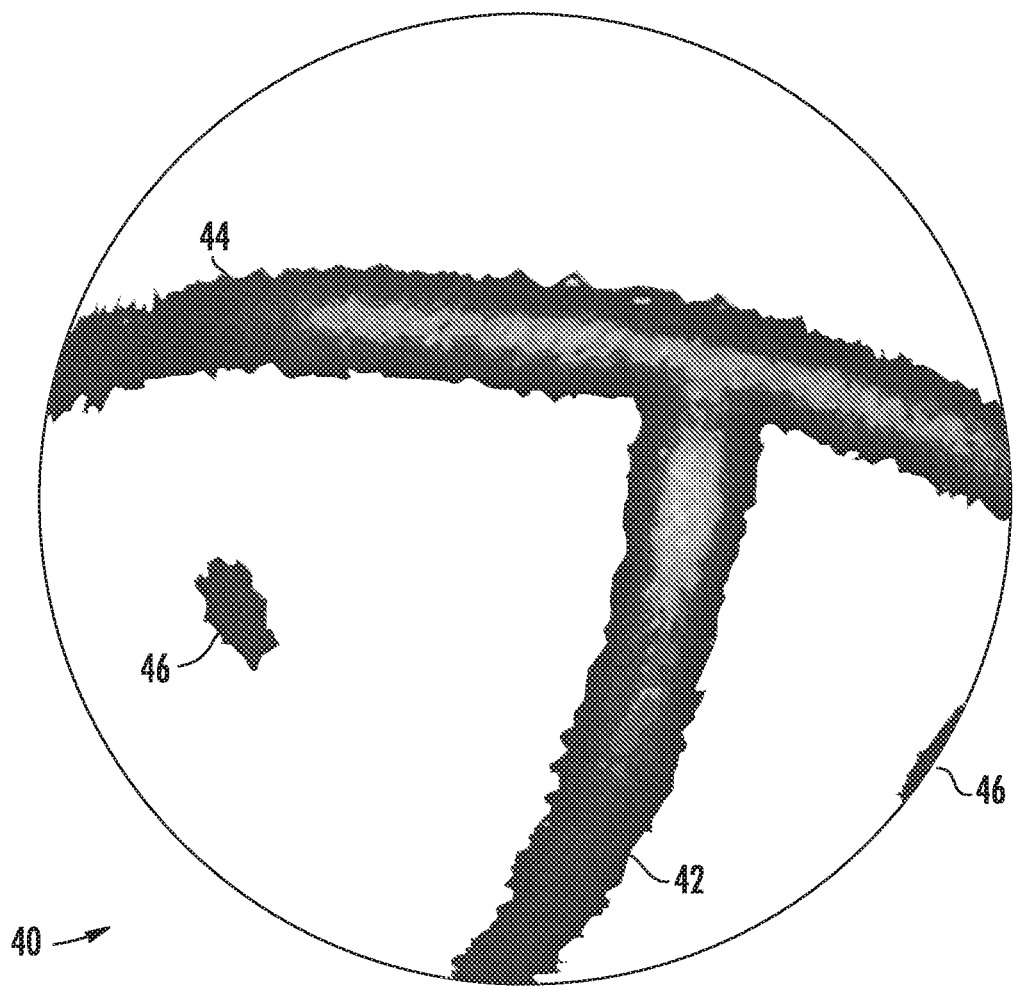
FIG. 5 is an oblique view of a far-field lighting pattern generated by the notification lighting unit as projected on the inside of a sphere.

With specific reference to FIG. 4B, light 33 emitted from the lighting element 30 is focused by the lens 20 to form the far-field light pattern 40 shown in FIG. 5. FIG. 5 shows an oblique view of the light pattern created by the lighting 30 and lens 20 as projected on to the inside of a sphere. Light pattern 40 includes a visible first bar 42, second bar 44, and twin spots 46.

The first bar 42 is visible as an arc that subtends approximately a 90° angle in the vertical plane. The second bar, 44, is visible in an arc that subtends approximately a 180° angle in the lateral plane. The first bar 42 and second bar 44 meet perpendicularly to form a T shape. One of the two spots 46 is on either side of the first bar 42, and the two spots 46 are both approximately the same distance from each of the first bar 42 and the second bar 44.

Figure 6A:
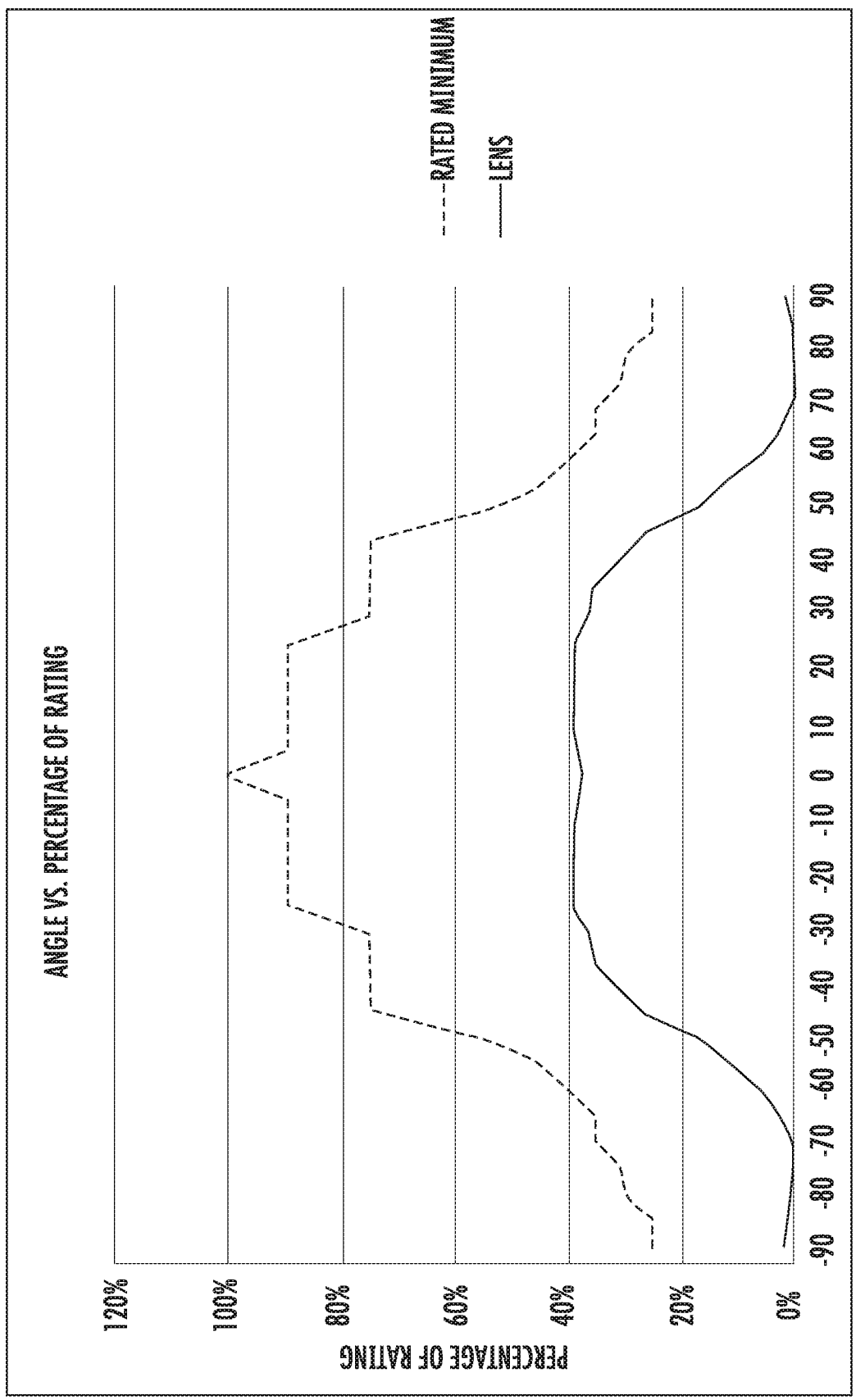
FIG. 6A is a graph of relative luminous intensity of light rays emanating through an arch surface of the lens.
Figure 6C:
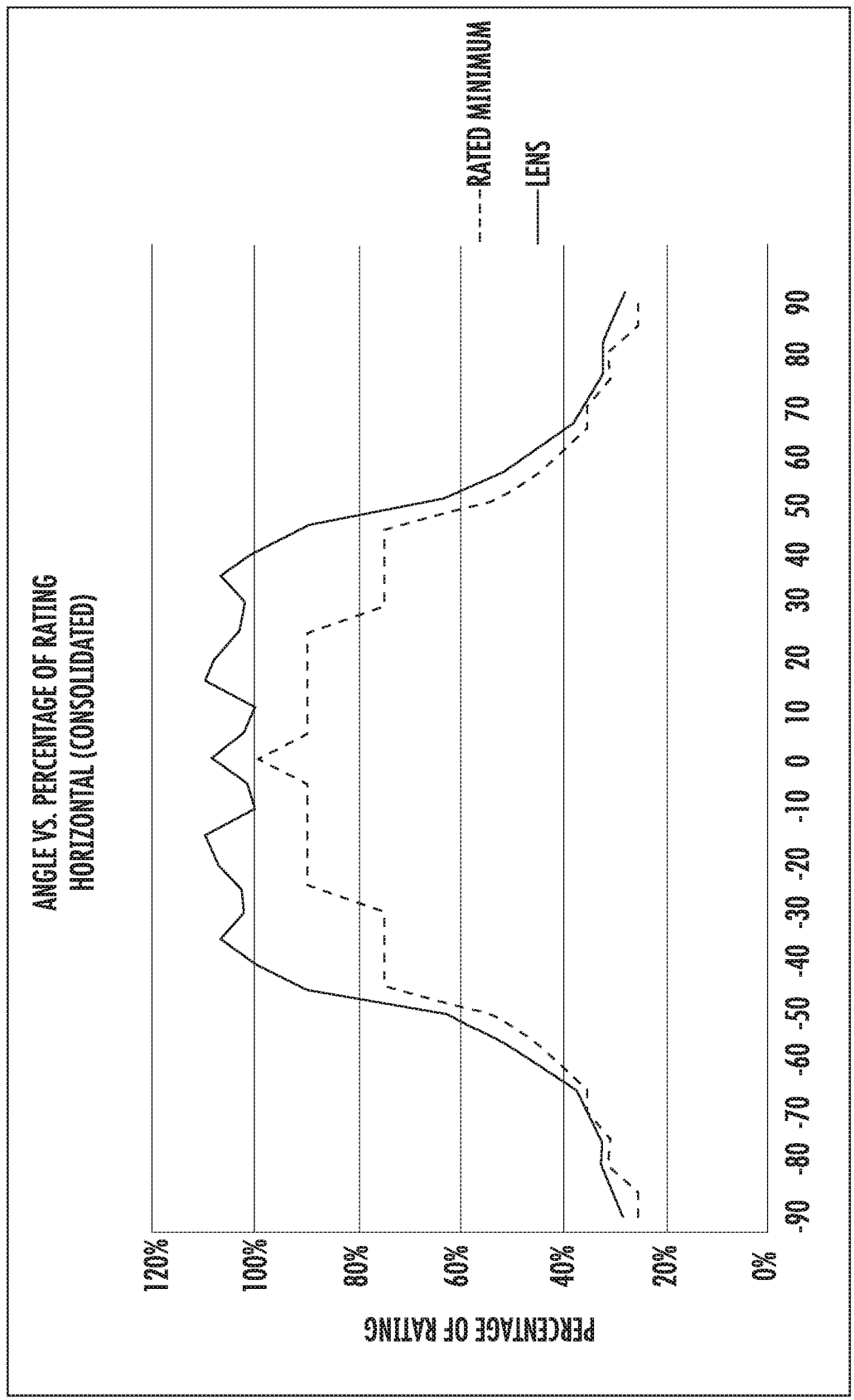
FIG. 6C is a graph of composite of relative luminous intensity of light rays emanating through both the arch and slope surfaces of the lens.

Upper surface 80 directs the light 33 from the lighting element 30 onto TIR surface 38 which in turn reflects the light 33 onto arch portion 22. Arch portion 22 redistributes the light into the lateral plane with an intensity distribution shown in FIG. 6A. Medial surface 82 directs the light 33 onto the slope surface 24. Slope surface 24 redistributes the light also into the lateral plane with an intensity distribution shown in FIG. 6B. The light from the arch portion 22 and slope portion 24 sum together to form an intensity distribution shown in FIG. 6C, which is visible as the second bar 44 in FIG. 5.

Figure 7:
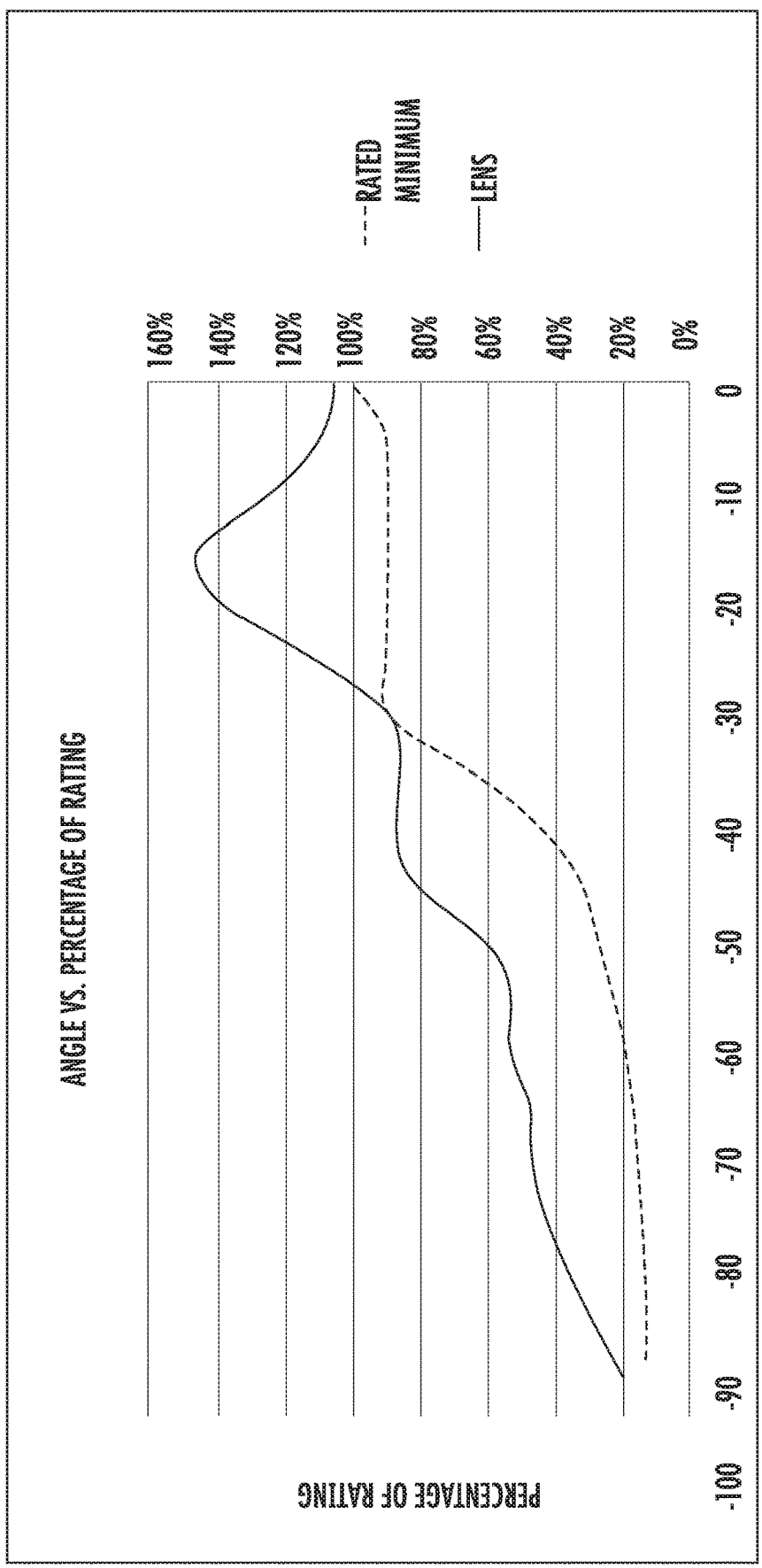
FIG. 7 is a graph of relative luminous intensity of light rays emanating through a hood surface of the lens.

Lower surface 84 directs the light 33 from the lighting element 30 onto the hood surface 26 which redistributes it with an intensity distribution shown in FIG. 7, and visible as the first bar 42 in FIG. 5.

Figure 8:
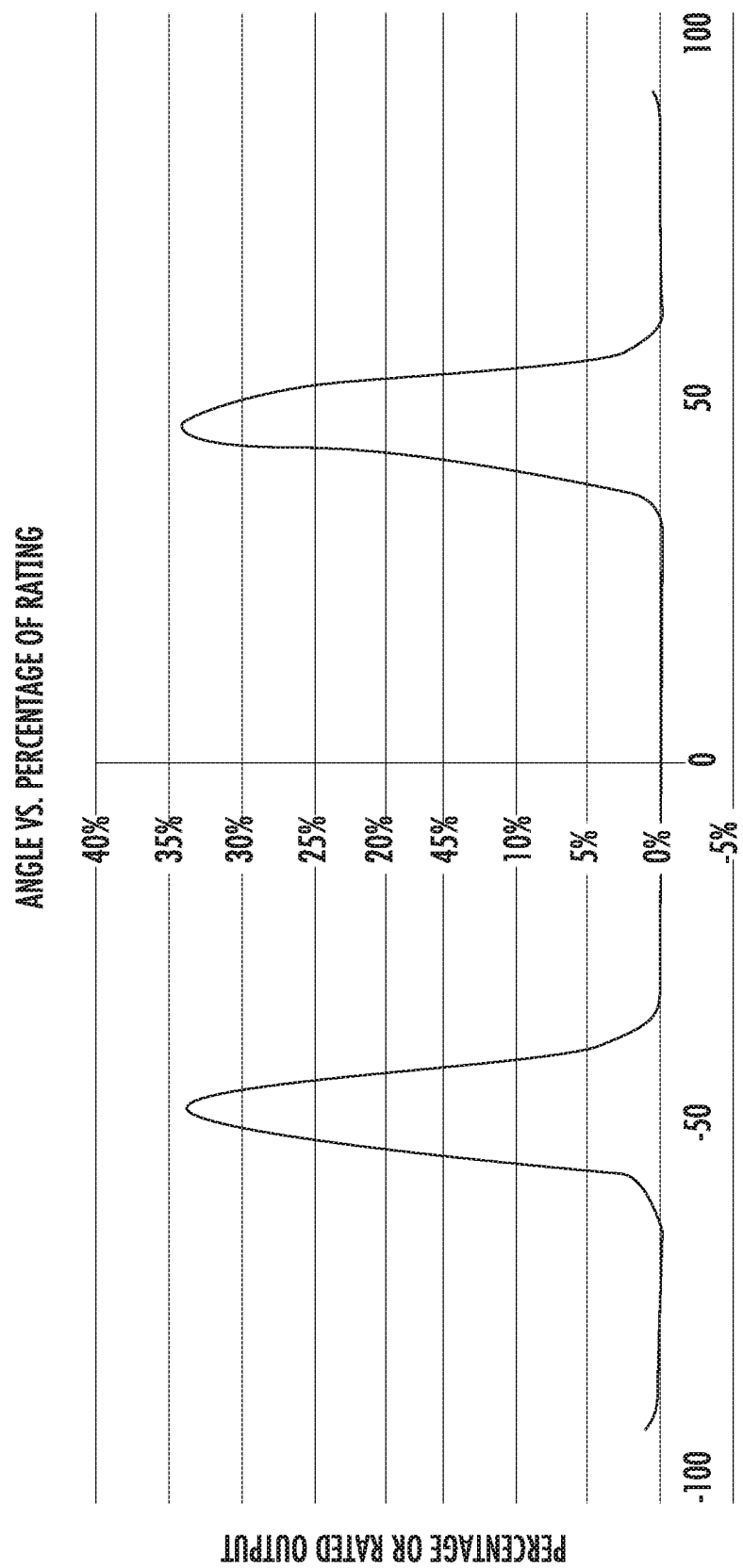
FIG. 8 is a graph of relative luminous intensity of light rays emanating through nodes of the lens.

Legs 37 form a void which allows light 33 to pass from the lighting element 30 to the leg-facet 86. Leg-facets 86 direct the light 33 onto the nodes 28, which redistribute it with a relative intensity distribution shown in FIG. 8, and is visible as spots 46 in FIG. 5.

FIGS. 6A through 8 plot relative illumination of the lighting pattern 40 in comparison to the rating requirements of UL Standard 1638. As such, the "rated minimum" line represents the minimum percentage of the unit's 10 rated luminous intensity that must be measureable from a given perspective when the unit 10 is activated. In other words, the rating of the unit 10 is limited by any point where the "lens" line meets the "rated minimum" line. For example, in FIG. 7, the "lens" line meets the "rated minimum" line at about −30° and about 90%.

By focusing light 33 tightly into the light pattern 40 such that little light is wasted on the unlit area, or on over-illumination of some points in the pattern 40 relative to others, the notification lighting unit 10 is able to clearly communicate an alarm state to observers at a broad range of perspectives with minimal power requirements. As such, the lighting element 30 may be of relatively low lighting capacity and power usage. According to one embodiment, the lighting element 30 generates a typical average luminous flux of about 17.2 lm at an average power consumption of about 0.182 W. According to another embodiment, the lighting element 30 generates a typical average luminous flux below 20 lm at an average power consumption of below 0.2 W. For comparison, one similarly rated known strobe unit uses a lighting element 30 that generates an average 63.4 lm and consumes an average 0.636 W. It should be understood that the luminous flux and power consumption measurements discussed above are merely exemplary. Lighting elements 30 generating differing luminous flux may be used to meet intended ratings, which may vary by application. The lens 20 according to the illustrated embodiment may enable units 10 to meet given ratings with lighting elements 30 of less light output, and therefore less power consumption, than would be necessary to meet the same ratings with known lenses. The low power usage, in turn, reduces the heat generated by the electronics 18 such that the lighting element 30 operates efficiently, even where lighting element 30 is not spatially separated from the electronics 18.

The light pattern 40 as described and illustrated above may be configured to meet industrial safety standards for visual components of alarm systems. For example, the notification lighting unit 10 may be used as part of a fire alarm system. In a more specific example, the light pattern 40 may meet the physical requirements for visible signaling devices for fire alarm and signaling systems.

Although an example embodiment has been disclosed, a worker of ordinary skill in this art would recognize that certain modifications would come within the scope of this disclosure. For that reason, the following claims should be studied to determine the scope and content of this disclosure.

What is claimed is:

1. A notification appliance comprising:
a lighting element and strobe drive electronics mounted on a single printed circuit board; and
a lens mounted to the printed circuit board over the lighting element, the lens including a cavity disposed over the lighting element wherein the lens includes an exterior surface with a slope portion having a convex shape approximating a portion of an ovoid with a major diameter oriented about an axis, an arch portion adjacent to the slope portion in an axial direction running along the axis, the arch being axially concave and laterally linear and a hood portion extending from the slope portion on a side opposite from the arch portion, the hood portion having a convex shape approximating a portion of an ovoid with a major diameter oriented perpendicular to the major diameter of the slope portion.

2. The notification appliance as recited in claim 1, wherein the lens includes a reflective surface under the arch portion and curved to reflect light from the lighting element out through the arch portion.

3. The notification appliance as recited in claim 2, wherein the cavity is defined by a faceted interior surface.

4. The notification appliance as recited in claim 3, wherein the faceted interior surface includes an axially upper portion faceted to direct light from the lighting element to the reflective surface under the arch portion, an axially medial portion faceted to direct light from the lighting element out through the slope portion, and an axially lower portion faceted to direct light from the lighting element out through the hood portion.

5. The notification appliance as recited in claim 4, wherein the axially upper portion is contiguous with the axially medial portion and the axially medial portion is contiguous with the axially lower portion.

6. The notification appliance as recited in claim 5, wherein the axially upper portion, axially medial portion, and axially lower portion extend laterally across a substantial entirety of the faceted interior surface at their respective axial locations.

7. The notification appliance of claim 1, wherein the lens further comprises two nodes on the slope near the hood portion and on opposite sides of the hood portion, and the cavity further comprises two legs, each leg extending toward one of the nodes, wherein portions of a faceted interior surface of the lens extending over the legs are faceted to direct light from the lighting element out through the nodes.

8. The notification appliance of claim 1, wherein the lighting element generates a typical average luminous flux below 20 lm at an average power consumption of below 0.2 W.

9. The notification appliance of claim 1, further comprising strobe control electronics on the circuit board.

10. A lens for a notification appliance, comprising:
an exterior surface that includes:
a slope portion having a convex shape approximating a portion of an ovoid with a major diameter oriented about an axis;
an arch portion adjacent to the slope portion in an axial direction running along the axis, the arch being axially concave and laterally linear; and
a hood portion extending from the slope portion on a side opposite from the arch portion, the hood portion having a convex shape approximating a portion of an ovoid with a major diameter oriented perpendicular to the major diameter of the slope portion.

11. The lens of claim 10, further comprising a cavity defined by a faceted interior surface.

12. The lens of claim 11, wherein the faceted interior surface includes an axially upper portion faceted to direct light from the cavity to a reflective surface under the arch portion, an axially medial portion faceted to direct light from the cavity out through the slope portion, and an axially lower portion faceted to direct light from the cavity out through the hood portion.

13. The lens of claim 12, wherein the reflective surface is curved to reflect light from the axially upper portion out through the arch portion.

14. The lens of claim 11, further comprising two nodes on the slope, each node disposed on an opposite side of the hood portion from the other.

15. The lens of claim 14, wherein the cavity further comprises two legs, each leg extending toward one of the nodes.

16. The lens of claim 15, wherein portions of the faceted interior surface extend over the legs, and the portions are faceted to direct light from the cavity toward the nodes.

17. The lens of claim 10, wherein the lens includes a cavity with legs extending radially outward from a center, an upper surface, a medial surface and a lower surface, the upper surface directs light onto a TIR surface which in turn reflects light onto an arch portion, the arch portion redistributes light into a lateral plane, the medial surface directs light onto a slope surface that redistributes light also into the lateral plane, and the lower surface directs the light onto a hood surface and the lens is shaped to focus light from the cavity into a far field lighting pattern comprising a first bar visible as a first arc that subtends approximately a 90° angle in a first plane, a second bar visible as a second arc that subtends approximately a 180° angle in a second plane, and two visible spots the spots disposed on opposite sides of the first bar.

* * * * *